United States Patent
Gao et al.

(10) Patent No.: US 12,231,035 B2
(45) Date of Patent: Feb. 18, 2025

(54) CHARGE PUMP CIRCUIT, CHIP, AND COMMUNICATION TERMINAL

(71) Applicant: VANCHIP (TIANJIN) TECHNOLOGY CO., LTD., Tianjin (CN)

(72) Inventors: Chenyang Gao, Tianjin (CN); Sheng Lin, Tianjin (CN)

(73) Assignee: VANCHIP (TIANJIN) TECHNOLOGY CO., LTD., Tianjin (CN)

( * ) Notice: Subject to any disclaimer, the term of this patent is extended or adjusted under 35 U.S.C. 154(b) by 16 days.

(21) Appl. No.: 18/299,056

(22) Filed: Apr. 12, 2023

(65) Prior Publication Data

US 2023/0291310 A1    Sep. 14, 2023

Related U.S. Application Data

(63) Continuation of application No. PCT/CN2021/113336, filed on Aug. 18, 2021.

(51) Int. Cl.
*H02M 3/07* (2006.01)
*H02M 1/00* (2006.01)
*H02M 1/15* (2006.01)

(52) U.S. Cl.
CPC ........... *H02M 1/15* (2013.01); *H02M 1/0043* (2021.05); *H02M 3/07* (2013.01); *H02M 3/073* (2013.01); *H02M 3/071* (2021.05)

(58) Field of Classification Search
None
See application file for complete search history.

(56) References Cited

U.S. PATENT DOCUMENTS

| | | | | |
|---|---|---|---|---|
| 5,818,766 A * | 10/1998 | Song | ...... | G11C 5/145 365/189.11 |
| 6,278,317 B1 * | 8/2001 | Hsu | ...... | H02M 3/073 327/536 |
| 6,300,839 B1 * | 10/2001 | Bazargan | ...... | H02M 3/073 323/280 |
| 7,224,207 B2 * | 5/2007 | Chou | ...... | H02M 3/07 327/536 |
| 7,733,162 B2 * | 6/2010 | Kim | ...... | G11C 11/4085 363/60 |

(Continued)

*Primary Examiner* — Jeffrey S Zweizig
(74) *Attorney, Agent, or Firm* — George Guosheng Wang; Upstream Research and Patent LLC

(57) ABSTRACT

Disclosed in the present invention are a charge pump circuit, a chip, and a communication terminal. The charge pump circuit comprises a phase clock generation module, an acceleration response control module, and a plurality of sub charge pump modules. By generating a plurality of clock signals with a fixed phase difference by means of the phase clock generation module, correspondingly controlling the plurality of sub charge pump modules to generate output voltages, and by means of the acceleration response control module, measuring the output voltage of each sub charge pump module, and separately outputting a logic signal to the phase clock generation module and each sub charge pump module, the frequency of the clock signals outputted by the phase clock generation module is changed, and the charge and discharge time of a capacitor in each sub charge pump module is reduced.

12 Claims, 8 Drawing Sheets

(56) References Cited

U.S. PATENT DOCUMENTS

| | | | |
|---|---|---|---|
| 8,217,711 B2 * | 7/2012 | Augustyniak | H02M 3/07 327/536 |
| 8,995,154 B2 * | 3/2015 | Kaneda | G11C 5/147 363/60 |

* cited by examiner

CHARGE PUMP CIRCUIT, CHIP, AND COMMUNICATION TERMINAL

BACKGROUND

Technical Field

The present invention relates to a charge pump circuit, and also relates to an integrated circuit chip and a corresponding communication terminal including the charge pump circuit, belonging to the field of analog integrated circuits.

Related Art

A traditional charge pump circuit depends on an external power supply, which can be realized by using a low dropout regulator or a direct current-direct current power supply. As shown in FIG. 1, when a low dropout regulator is used for supplying power to both a charge pump circuit and a high-precision circuit, due to the characteristics of the charge pump circuit, switching of an internal switch in the charge pump circuit is often accompanied by a large transient peak current. If the peak current is too large, the power supply stability of a power supply system may be affected, and the precision of other high-precision circuits may also be affected. For example, the effective number of bits of a high-precision digital-to-analog converter, an output offset voltage of a precision operational amplifier or the like may be affected.

With continuous improvement of the integration of the integrated circuits, the charge pump circuit is more and more integrated in the chip. However, because the charge pump circuit has high requirements on the power supply, in order to reduce ripple interference of the charge pump circuit on the power supply, it is generally necessary to add a large off-chip capacitor to a power supply port. This not only increases the cost of the power supply system, but also reduces the reliability of the whole system.

The Chinese invention patent No. ZL 201810049855.1 discloses a charge pump circuit. The working principle of this circuit is to divide a charge pump into N stages of sub-charge pump circuits, then delay clock signals one by one to provide corresponding clock signals for the N stages of sub-charge pumps, then measure the size of output voltage ripples of the charge pump by means of a control unit, and then adjust the delay to reduce the output voltage ripples of the charge pump. However, in order to reduce the output voltage ripples of the charge pump circuit, the number of the sub-charge pump circuits may be increased, which not only increases the circuit complexity, but also increases the peak current of the input power supply.

SUMMARY

The primary technical problem to be solved by the present invention is to provide a charge pump circuit.

Another technical problem to be solved by the present invention is to provide an integrated circuit chip and a communication terminal including the foregoing charge pump circuit.

In order to realize the foregoing purpose, the present invention adopts the technical solution as follows:

According to a first aspect of embodiments of the present invention, provided is a charge pump circuit, including a phase clock generation module, an acceleration response control module and a plurality of sub charge pump modules, wherein an output end of the phase clock generation module is connected to a clock control end of each of the sub charge pump modules, the plurality of sub charge pump modules are connected in parallel and then correspondingly connected to an input power supply end and an output voltage end, the output voltage end is connected to an input end of the acceleration response control module, and an output end of the acceleration response control module is connected to input ends of the phase clock generation module and each of the sub charge pump modules;

the phase clock generation module generates a plurality of clock signals with a fixed phase difference, to correspondingly control the plurality of sub charge pump modules to generate output voltages, and meanwhile after the output voltages are measured by means of the acceleration response control module, separately outputs a logic signal to the phase clock generation module and each of the sub charge pump modules, so that when the output voltages do not reach a target value, the phase clock generation module generates an acceleration clock signal to generate the output voltages rapidly, and when the output voltages reach the target value, the phase clock generation module controls each of the sub charge pump modules to maintain the normal output voltage.

Preferably, the phase clock generation module includes a first phase inverter and a plurality of phase clock sub circuits each composed of a first NMOS transistor, a first capacitor, a second capacitor, an output node and a second phase inverter, wherein an input end of the first phase inverter is connected to an output end of the acceleration response control module, an output end of the first phase inverter is connected to a grid of each of the first NMOS transistors, the first capacitor is serially connected between a drain of each of the first NMOS transistors and the corresponding output node, a source of each of the first NMOS transistors is grounded, each of the output nodes is connected to the corresponding sub charge pump module, the second capacitor is serially connected between each of the output nodes and the ground, and after being cascaded and correspondingly connected to a power supply and the ground, the second phase inverters are connected end to end to form a ring oscillator.

Preferably, the second phase inverter includes a first PMOS transistor and a second NMOS transistor, a grid and a drain of the first PMOS transistor are correspondingly connected to a grid and a drain of the second NMOS transistor, a source of the first PMOS transistor is connected to a power supply, and a source of the second NMOS transistor is grounded.

Preferably, according to a state of the logic signal outputted by the acceleration response control module to the phase clock generation module, the size of a load capacitor of the output node of the phase clock generation module is changed, to adjust the size of an oscillation frequency of the plurality of clock signals with the fixed phase difference generated by the ring oscillator.

Preferably, according to a state of the logic signal outputted by the acceleration response control module to the phase clock generation module, a width to length ratio of a switching tube in each of the second phase inverters is changed, to change the equivalent resistance of the second phase inverter, so as to adjust the size of an oscillation frequency of the plurality of clock signals with the fixed phase difference generated by the ring oscillator.

Preferably, when each of the sub charge pump modules provides a voltage output higher than an input power supply, each of the sub charge pump module includes a third NMOS transistor, a fourth NMOS transistor, a second PMOS transistor, a third PMOS transistor, a fourth PMOS transistor, a fifth PMOS transistor, a first select switch, a second select switch, a third select switch, a fourth select switch, a third capacitor, a fourth capacitor, a fifth capacitor, a sixth capacitor and an eighth capacitor, wherein a substrate end and a source of the third NMOS transistor, as well as a substrate end and a source of the fourth NMOS transistor are separately connected to the input power supply; a grid of the third NMOS transistor is separately connected to a drain of the fourth NMOS transistor, a polar plate of the fourth capacitor and a drain of the second PMOS transistor; a drain of the third NMOS transistor is separately connected to a grid of the fourth NMOS transistor, a polar plate of the third capacitor and a drain of the third PMOS transistor; a substrate end and a source of the second PMOS transistor, a substrate end and a source of the third PMOS transistor, a substrate end and a source of the fourth PMOS transistor, as well as a substrate end and a source of the fifth PMOS transistor are respectively connected to the output voltage end and one end of the eighth capacitor, and the other end of the eighth capacitor is grounded; a grid of the second PMOS transistor is separately connected to a polar plate of the sixth capacitor, a drain of the fourth PMOS transistor and a grid of the fifth PMOS transistor; a grid of the third PMOS transistor is separately connected to a polar plate of the fifth capacitor, a drain of the fifth PMOS transistor and a grid of the fourth PMOS transistor; the other polar plates of the third capacitor, the fourth capacitor, the fifth capacitor and the sixth capacitor are connected to movable ends of the corresponding select switches; the movable end of each of the select switches is correspondingly connected to the respective clock control ends; the clock control ends of the select switches are correspondingly connected to the same output node of the phase clock generation module; one static end of each of the select switches is connected to the power supply and the other static end is connected to a grounding end; a response control ends of each of the select switches is connected to an output end of the acceleration response control module; and an input end of the acceleration response control module is connected to the output voltage end.

Preferably, when clock signals outputted by a same output node in the phase clock generation module control on and off of the corresponding select switches, a first clock signal and a third clock signal are non-overlapping clock signals, and a second clock signal and a fourth clock signal are non-overlapping clock signals, wherein the non-overlapping time is Tnov1; and the first clock signal and the second clock signal are non-overlapping clock signals, and the third clock signal and the fourth clock signal are non-overlapping clock signals, wherein the non-overlapping time is Tnov3 and Tnov2 respectively, and the relationship of the non-overlapping time is Tnov2=2*Tnov1+Tnov3.

Preferably, when each of the sub charge pump modules provides a voltage output lower than a grounding voltage, a third NMOS transistor and a fourth NMOS transistor in each of the sub charge pump modules are correspondingly replaced by a fifth NMOS transistor and a sixth NMOS transistor, and a second PMOS transistor, a third PMOS transistor, a fourth PMOS transistor and a fifth PMOS transistor are correspondingly replaced with a sixth PMOS transistor, a seventh PMOS transistor, an eighth PMOS transistor and a ninth PMOS transistor.

Preferably, each of the select switches includes a tenth PMOS transistor, a seventh NMOS transistor, an OR-gate, an AND-gate, a third phase inverter, at least one eleventh PMOS transistor and at least one eighth NMOS transistor, wherein grids of the tenth PMOS transistor and the seventh NMOS transistor are connected to serve as a clock control end of the select switch, to be connected to one output node of the phase clock generation module; the grids of the tenth PMOS transistor and the seventh NMOS transistor are correspondingly connected to one input end of the OR-gate and one input end of the AND-gate respectively; drains of the tenth PMOS transistor and the seventh NMOS transistor and drains of each of the eleventh PMOS transistor and the corresponding eighth NMOS transistor are mutually connected to serve as the movable end of the select switch, to be connected to the other polar plate of the corresponding capacitor; sources of the tenth PMOS transistor and each of the eleventh PMOS transistor are separately connected to the power supply; sources of the seventh NMOS transistor and each of the eighth NMOS transistors are separately grounded; a grid of each of the eleventh PMOS transistors is connected to an output end of the OR-gate; a grid of each of the eighth NMOS transistor is connected to an output end of the AND-gate; the other input end of the OR-gate is connected to an output end of the third phase inverter; and the other input end of the AND-gate is connected to an input end of the third phase inverter and an output end of the acceleration response control module.

Preferably, the acceleration response control module includes a first resistor, a second resistor and a hysteresis comparator, wherein one end of the first resistor is separately connected to an output voltage end of each of the sub charge pump modules, the other end of the first resistor is separately connected to one end of the second resistor and an inverting input end of the hysteresis comparator, the other end of the second resistor is grounded, a positive phase input end of the hysteresis comparator is connected to a reference voltage, an output end of the hysteresis comparator is separately connected to an input end of the first phase inverter and an input end of a third phase inverter in each of the sub charge pump modules.

According to a second aspect of embodiments of the present invention, provided is an integrated circuit chip, including the foregoing charge pump circuit.

According to a third aspect of embodiments of the present invention, provided is a communication terminal, including the foregoing charge pump circuit.

According to the charge pump circuit provided by the present invention, the plurality of clock signals with the fixed phase difference are generated by means of the phase clock generation module, to correspondingly control the plurality of sub charge pump modules to generate the output voltages, the output voltage of each of the sub charge pump modules is measured by means of the acceleration response control module, and the logic signal is separately outputted to the phase clock generation module and each of the sub charge pump modules, to change the frequency of the clock signals outputted by the phase clock generation module, and reduce the charge and discharge time of the capacitor in each of the sub charge pump modules. By using the present invention, the peak current drawn by the charge pump circuit from the input power supply can be effectively reduced, and ripple interference of the charge pump circuit on the input power supply and an output voltage signal is reduced, thereby reducing the dependence of the input power supply on an off-chip capacitor.

DETAILED DESCRIPTION

The technical content of the present invention will be further described in detail below in combination with the accompanying drawings and specific embodiments.

Figure 1:
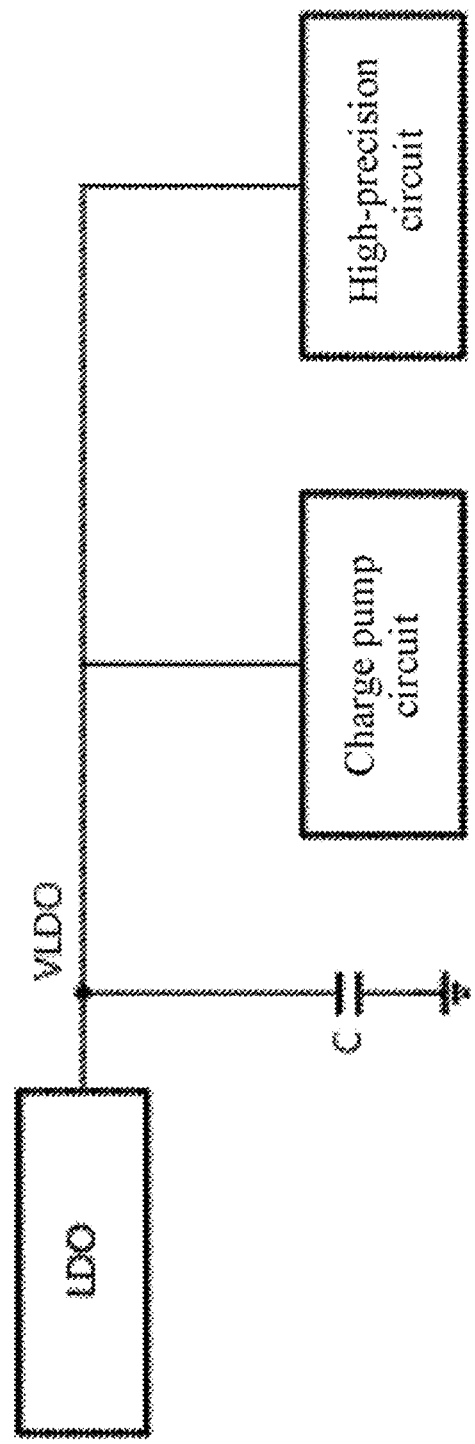
FIG. 1 is a typical application block diagram of an existing charge pump circuit.
Figure 2:
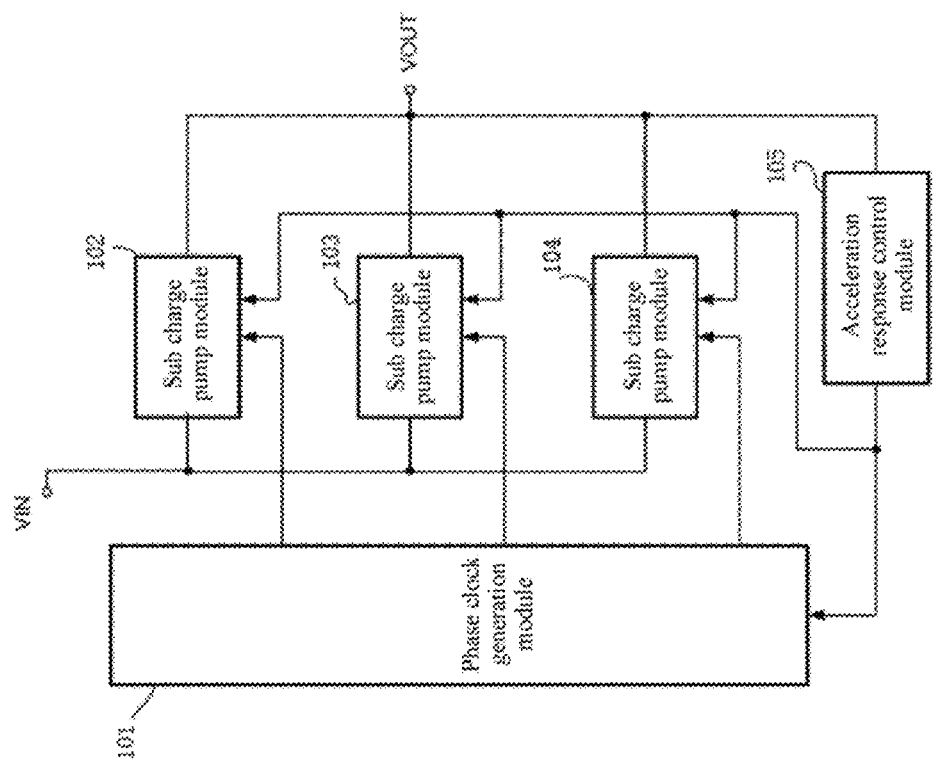
FIG. 2 is a structural block diagram of a charge pump circuit provided by an embodiment of the present invention.

In order to reduce large ripple interference and noise caused by a charge pump circuit to an input power supply, reduce the dependence of the input power supply on an off-chip capacitor, reduce the cost of a power supply system and improve the reliability of the system, so as to generate a charge pump output voltage stably and rapidly, as shown in FIG. 2, an embodiment of the present invention first provides a charge pump circuit, including a phase clock generation module 101, an acceleration response control module 105 and a plurality of sub charge pump modules (for example, a plurality of sub charge pump modules 102, 103 and 104 as shown in FIG. 1). An output end of the phase clock generation module 101 is connected to a clock control end of each of the sub charge pump modules. The plurality of sub charge pump modules are connected in parallel and then correspondingly connected to an input power supply end VIN and an output voltage end VOUT. The output voltage end VOUT is connected to an input end of the acceleration response control module 105. An output end of the acceleration response control module 105 is connected to input ends of the phase clock generation module 101 and each of the sub charge pump modules.

The phase clock generation module 101 is configured to generate a plurality of clock signals with a fixed phase difference, to correspondingly control the plurality of sub charge pump modules to generate output voltages. Meanwhile, the output voltage of each of the sub charge pump modules is measured by means of the acceleration response control module 105. A logic signal is separately outputted to the phase clock generation module 101 and each of the sub charge pump modules. Therefore, when the output voltages of the plurality of sub charge pump modules do not reach a target value, the phase clock generation module 101 generates an acceleration clock signal to control each of the sub charge pump modules to generate the output voltage rapidly, and when the output voltages of the plurality of sub charge pump modules reach the target value, the phase clock generation module 101 controls each of the sub charge pump modules to maintain the normal output voltage.

It should be noted that in different embodiments of the present invention, the phase difference may be 45 degrees, 60 degrees, 90 degrees, 120 degrees or 180 degrees separately, and the numbers of the corresponding sub charge pump modules are 8, 6, 4, 3 or 2 separately. The number of the sub charge pump modules may be flexibly adjusted on the premise that rising edges and falling edges of the clock signals with the fixed phase difference received by the respective sub charge pump modules at the same time will not overlap. For example, for the 3 sub charge pump modules 102, 103 and 104 shown in FIG. 1, the corresponding phase difference is 360 degrees/3=120 degrees, and so on.

Figure 3:
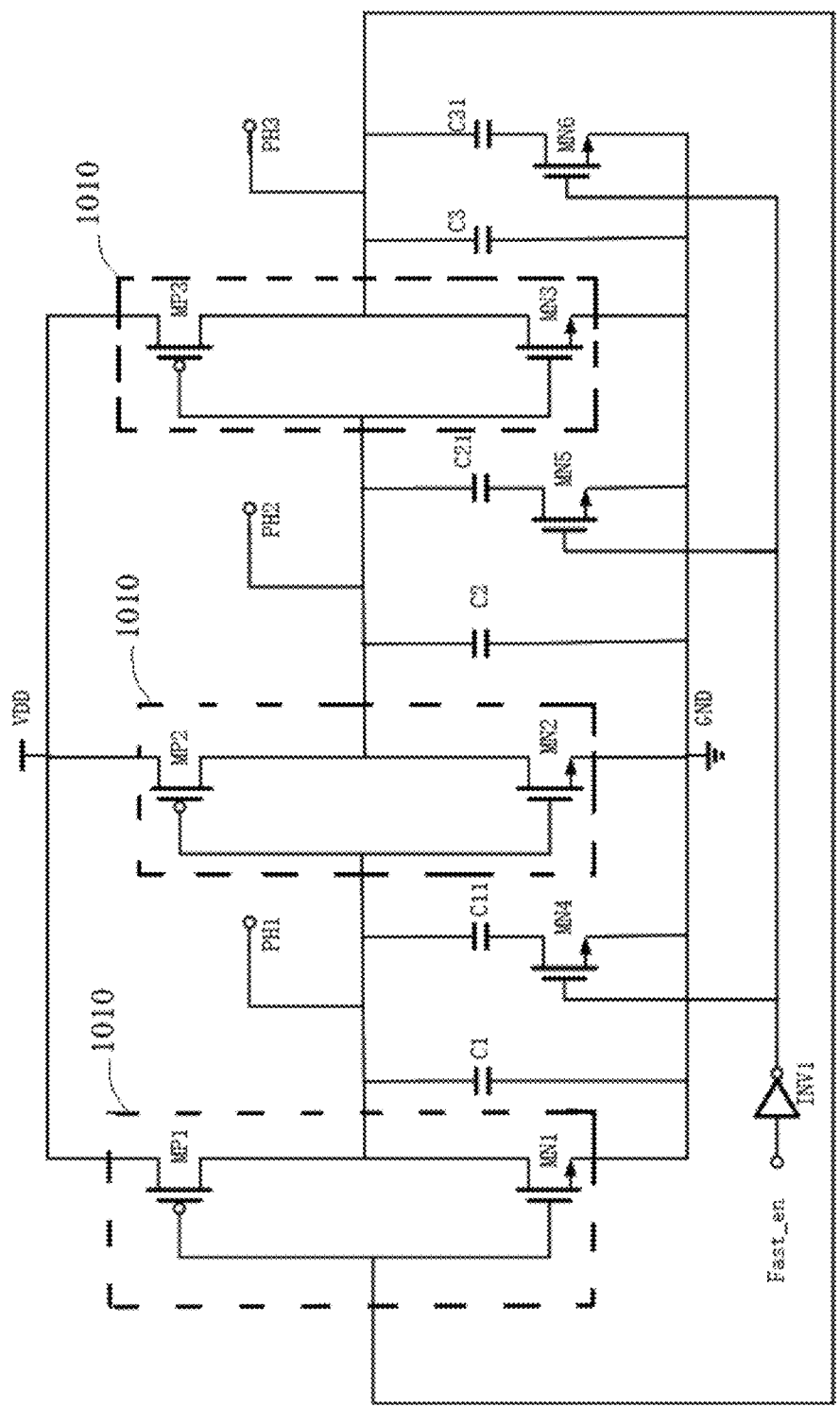
FIG. 3 is a schematic circuit diagram of a phase clock generation module in a charge pump circuit provided by an embodiment of the present invention.

As shown in FIG. 3, the phase clock generation module 101 includes a first phase inverter INV1, and a plurality of phase clock sub circuits each composed of a first NMOS transistor (for example, one of first NMOS transistors MN4-MN6), a first capacitor (for example, one of capacitors C11-C31), a second capacitor (for example, one of capacitors C1-C3), an output node and a second phase inverter 1010. An input end of the first phase inverter INV1 is connected to an output end of the acceleration response control module 105. An output end of the first phase inverter INV1 is connected to a grid of each of the first NMOS transistors. The first capacitor is serially connected between a drain of each of the first NMOS transistors and the corresponding output node (output nodes PH1, PH2 or PH3). A source of each of the first NMOS transistors is grounded. Each of the output nodes is connected to the corresponding sub charge pump module. The second capacitor is serially connected between each of the output nodes and the ground. After being cascaded and correspondingly connected to a power supply VDD and the ground, the second phase inverters 1010 are connected end to end to form a ring oscillator. The number of the second phase inverters 1010 may be flexibly adjusted on the premise that rising edges and falling edges of clock signals with a fixed phase difference generated by the second phase inverters 1010 do not overlap (It is similar to the way of adjusting the number of the sub charge pump modules, and it will not be repeated here).

As shown in FIG. 3, the phase clock generation module 101 generating 3 clock signals with the phase difference of 120 degrees is taken as an example. The phase clock generation module 101 includes a first phase inverter INV1, 3 first NMOS transistors MN4-MN6, 3 first capacitors C11-C31, 3 second capacitors C1-C3, 3 output nodes PH1, PH2 and PH3 and 3 second phase inverters 1010. An input end of the first phase inverter INV1 is connected to an output end of the acceleration response control module 105. An output end of the first phase inverter INV1 is separately connected to grids of the 3 first NMOS transistors MN4-MN6. The first capacitor C11 is serially connected between the first NMOS transistor MN4 and the output node PH1. The first capacitor C21 is serially connected between the first NMOS transistor MN5 and the output node PH2. The first capacitor C31 is serially connected between the first NMOS transistor MN6 and the output node PH3. Sources of the 3 first NMOS transistors MN4-MN6 are grounded. The 3 output nodes PH1, PH2 and PH3 are connected to the corresponding sub charge pump modules. The second capacitor C1 is serially connected between the output node PH1 and the ground. The second capacitor C2 is serially connected between the output node PH2 and the ground. The second capacitor C3 is serially connected between the output node PH3 and the ground. After being cascaded and correspondingly connected to the power supply VDD and the ground, the second phase inverters 1010 are connected end to end to form a ring oscillator.

Each of the second phase inverters includes a first PMOS transistor and a second NMOS transistor. A grid and a drain of the first PMOS transistor are correspondingly connected to a grid and a drain of the second NMOS transistor. A source of the first PMOS transistor is connected to the power supply. A source of the second NMOS transistor is grounded. As shown in FIG. 3, taking the phase clock generation module 101 including 3 second phase inverters as an example, the first PMOS transistor MP1 and the second NMOS transistor MN1 form one second phase inverter, the first PMOS transistor MP2 and the second NMOS transistor MN2 form one second phase inverter, the first PMOS transistor MP3 and the second NMOS transistor MN3 form one second phase inverter, and thus the three stages of second phase inverters are obtained. The second phase inverters, after being cascaded, are connected end to end. That is, drains of the first PMOS transistor MP3 and the second NMOS transistor MN3 of the second phase inverter in the third stage are connected together and then connected to grids of the first PMOS transistor MP1 and the second NMOS transistor MN1 of the second phase inverter in the first stage.

The output nodes PH1-PH3 of the phase clock generation module 101 are output nodes of the corresponding second phase inverters 1010. The first capacitors C11-C31 and the second capacitors C1-C3 are load capacitors of the output nodes of the second phase inverters 1010, respectively. Gate voltages of the first NMOS transistors MN4-MN6 are an output of the first phase inverter INV1. The first phase inverter INV receives a logic signal outputted by the acceleration response control module 105. The oscillation frequency f of the ring oscillator composed of the second phase inverters 1010 has the following relationship:

$$f \propto \frac{1}{R_{on}C_L}$$

wherein, $R_{on}$ represents the equivalent resistance of the second phase inverter 1010, and CL represents the load capacitor of the output node of the second phase inverter 1010. Therefore, when the logic signal fast_en outputted by the acceleration response control module 105 is at a high level, gate voltages of the first NMOS transistors MN4-MN6 are at a low level, so that the first NMOS transistors MN4-MN6 are in an off state, and the load capacitors of the output nodes of the second phase inverters 1010 are second capacitors C1-C3. That is, the load capacitor of the output node PH1 is the second capacitor C1, the load capacitor of the output node PH2 is the second capacitor C2, and the load capacitor of the output node PH3 is the second capacitor C3. When the logic signal fast_en outputted by the acceleration response control module 105 is at a low level, the gate voltages of the first NMOS transistors MN4-MN6 are at a high level, so that the first NMOS transistors MN4-MN6 are in an on state, and the load capacitors of the output nodes of the second phase inverters 1010 are the second capacitors C1-C3 and the first capacitors C11-C31. That is, the equivalent load capacitor of the output node PH1 is the second capacitor C1 and the first capacitor C11 connected in parallel, the equivalent load capacitor of the output node PH2 is the second capacitor C2 and the first capacitor C21 connected in parallel, and the equivalent load capacitor of the output node PH3 is the second capacitor C3 and the first capacitor C31 connected in parallel.

From the foregoing, when the logic signal outputted by the acceleration response control module 105 is at a high level, the gate voltage of the first NMOS transistor is at a low level with regard to the logic signal outputted by the acceleration response control module 105, and the load capacitor of the output node of each of the second phase inverters 1010 is reduced, so that the oscillation frequency of the clock signals outputted by the ring oscillator is increased, and when the output voltages of the plurality of sub charge pump modules do not reach the target value, the phase clock generation module 101 generates acceleration clock signals, to control the sub charge pump modules to rapidly generate the output voltages. Otherwise, when the logic signal outputted by the acceleration response control module 105 is at a low level, the gate voltage of the first NMOS transistor is at a high level with regard to the logic signal outputted by the acceleration response control module 105, and the load capacitor of the output node of each of the second phase inverters 1010 is increased, so that the oscillation frequency of the clock signals outputted by the ring oscillator is reduced, and when the output voltages of the plurality of sub charge pump modules reaches the target value, the phase clock generation module 101 controls each of the sub charge pump modules to maintain the normal output voltage.

Therefore, according to the state of the logic signal outputted by the acceleration response control module 105, by changing the size of the load capacitor of the output node of each of the second phase inverters 1010, the size of the oscillation frequency of the plurality of clock signals with the fixed phase difference generated by the ring oscillator is adjusted. On the basis of the clock signals with the phase difference of 120 degrees outputted by the phase clock generation module 101, each of the sub charge pump modules is controlled to generate the output voltage, and the number of the capacitors, which are charged by the input power supply at the same time, in each of the sub charge pump modules is reduced, so that the sub charge pump modules draw currents from the input power supply at the same time in a time-sharing manner, the peak current drawn by each of the sub charge pump modules from the input power supply is reduced, and thus input power supply ripples caused by the too large peak currents to the input power supply is reduced.

In addition, according to the state of the logic signal outputted by the acceleration response control module 105, the equivalent resistance of each of the second phase inverters 1010 can be changed by changing a width to length ratio (W/L ratio for short) of a conductive channel of the switch tube (that is, the first PMOS transistor and the second NMOS transistor) in the second phase inverter 1010, and thus the size of the oscillation frequency of the plurality of clock signals with the fixed phase difference generated by the ring oscillator can be adjusted, which is not repeated here.

Figure 4:
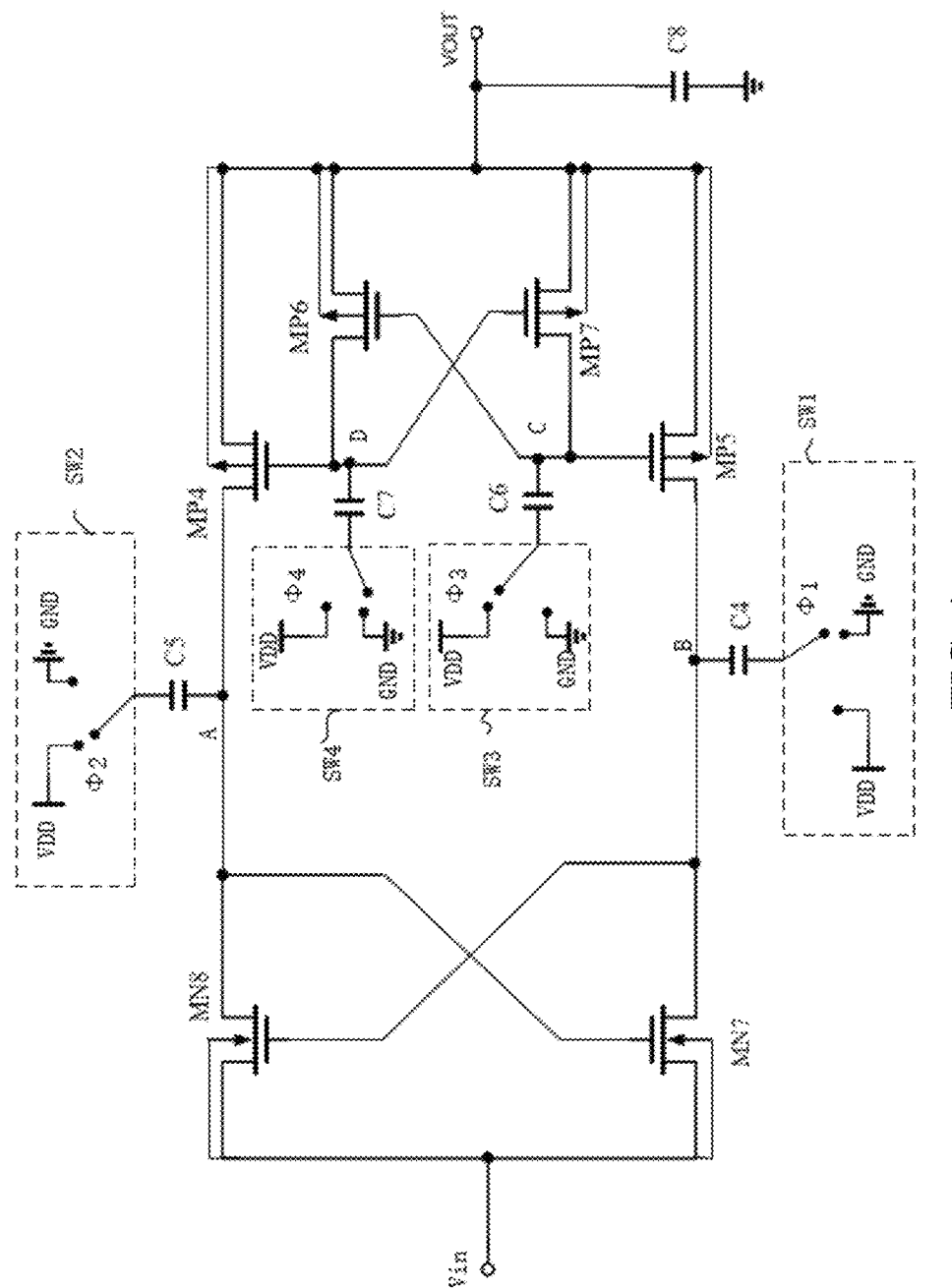
FIG. 4 is a schematic circuit diagram of each of sub charge pump modules in a charge pump circuit provided by an embodiment of the present invention.

When each of the sub charge pump modules provides a voltage output higher than an input power supply Vin, as shown in FIG. 4, each of the sub charge pump modules includes a third NMOS transistor MN7, a fourth NMOS transistor MN8, a second PMOS transistor MP4, a third PMOS transistor MP5, a fourth PMOS transistor MP6, a fifth PMOS transistor MP7, a first select switch SW1, a second select switch SW2, a third select switch SW3, a fourth select switch SW4, a third capacitor C4, a fourth capacitor C5, a fifth capacitor C6, a sixth capacitor C7 and an eighth capacitor C8. The connection relationship of the parts in each of the sub charge pump modules is as follows. A substrate end and a source of the third NMOS transistor MN7, as well as a substrate end and a source of the fourth NMOS transistor MN8 are separately connected to the input power supply Vin. A grid of the third NMOS transistor MN7 is separately connected to a drain of the fourth NMOS transistor MN8, a polar plate A of the fourth capacitor C5 and a drain of the second PMOS transistor MP4. A drain of the third NMOS transistor MN7 is separately connected to a grid of the fourth NMOS transistor MN8, a polar plate B of the third capacitor C4 and a drain of the third PMOS transistor MP5. A substrate end and a source of the second PMOS transistor MP4, a substrate end and a source of the third PMOS transistor MP5, a substrate end and a source of the fourth PMOS transistor MP6, as well as a substrate end and a source of the fifth PMOS transistor MP7 are respectively connected to an output voltage end VOUT and one end of the eighth capacitor C8. The other end of the eighth capacitor C8 is grounded. A grid of the second PMOS transistor MP4 is separately connected to a polar plate D of the sixth capacitor C7, a drain of the fourth PMOS transistor MP6 and a grid of the fifth PMOS transistor MP7. A grid of the third PMOS transistor MP5 is separately connected to a polar plate C of the fifth capacitor C6, a drain of the fifth PMOS transistor MP7 and a grid of the fourth PMOS transistor MP6. The other polar plate of the third capacitor C4 is connected to a movable end of the first select switch SW1. The other polar plate of the fourth capacitor C5 is connected to a movable end of the second select switch SW2. The other polar plate of the fifth capacitor C6 is connected to a movable end of the third select switch SW3. The other polar plate of the sixth capacitor C7 is connected to a movable end of the fourth select switch SW4. The movable ends of the first select switch SW1, the second select switch SW2, the third select switch SW3 and the fourth select switch SW4 are correspondingly connected to respective clock control ends. The clock control ends of the first select switch SW1, the second select switch SW2, the third select switch SW3 and the fourth select switch SW4 are correspondingly connected to the same output node of the phase clock generation module 101. One static end of the first select switch SW1, one static end of the second select switch SW2, one static end of the third select switch SW3 and one static end of the fourth select switch SW4 are connected to the power supply VDD, and the other static ends are connected to a grounding end GND. Response control ends of the first select switch SW1, the second select switch SW2, the third select switch SW3 and the fourth select switch SW4 are connected to an output end of the acceleration response control module 105. An input end of the acceleration response control module 105 is connected to the output voltage end VOUT.

When the phase clock generation module 101 provides the clock signals with the phase difference of 120 degrees for each of the sub charge pump modules, in each of the sub charge pump modules, the first select switch SW1, the second select switch SW2, the third select switch SW3 and the fourth select switch SW4 receive the clock signals from the same output node in the phase clock generation module 101 in a time-sharing manner. That is, the first select switch SW1 receives a first clock signal $\Phi 1$ by means of the clock control end. The second select switch SW2 receives a second clock signal $\Phi 2$ by means of the clock control end. The third select switch SW3 receives a third clock signal $\Phi 3$ by means of the clock control end. The fourth select switch SW4 receives a fourth clock signal 4 by means of the clock control end. Therefore, the select switches SW1-SW4 are controlled by the clock signals $\Phi 1$-$\Phi 4$ outputted by the same output node in the phase clock generation module 101, to perform charge and discharge of the capacitors C4-C7 in a time-sharing manner, and charges on the capacitors C4-C7 are transferred to the eighth capacitor C8 by means of on and off of the third NMOS transistor MN7, the fourth NMOS transistor MN8, the second PMOS transistor MP4, the third PMOS transistor MP5, the fourth PMOS transistor MP6 and the fifth PMOS transistor MP7 as switches. The select switches SW1-SW4 are respectively controlled by means of the clock signals $\Phi 1$-$\Phi 4$, and charge and discharge of the capacitors C4-C7 are performed in a time-sharing manner, to reduce the number of the capacitors, which are charged by the input power supply at the same time, in each of the sub charge pump modules, so as to reduce the input power supply ripples caused by the too large peak current to the input power supply, and reduce the dependence of the input power supply on the off-chip capacitor.

Figure 5:
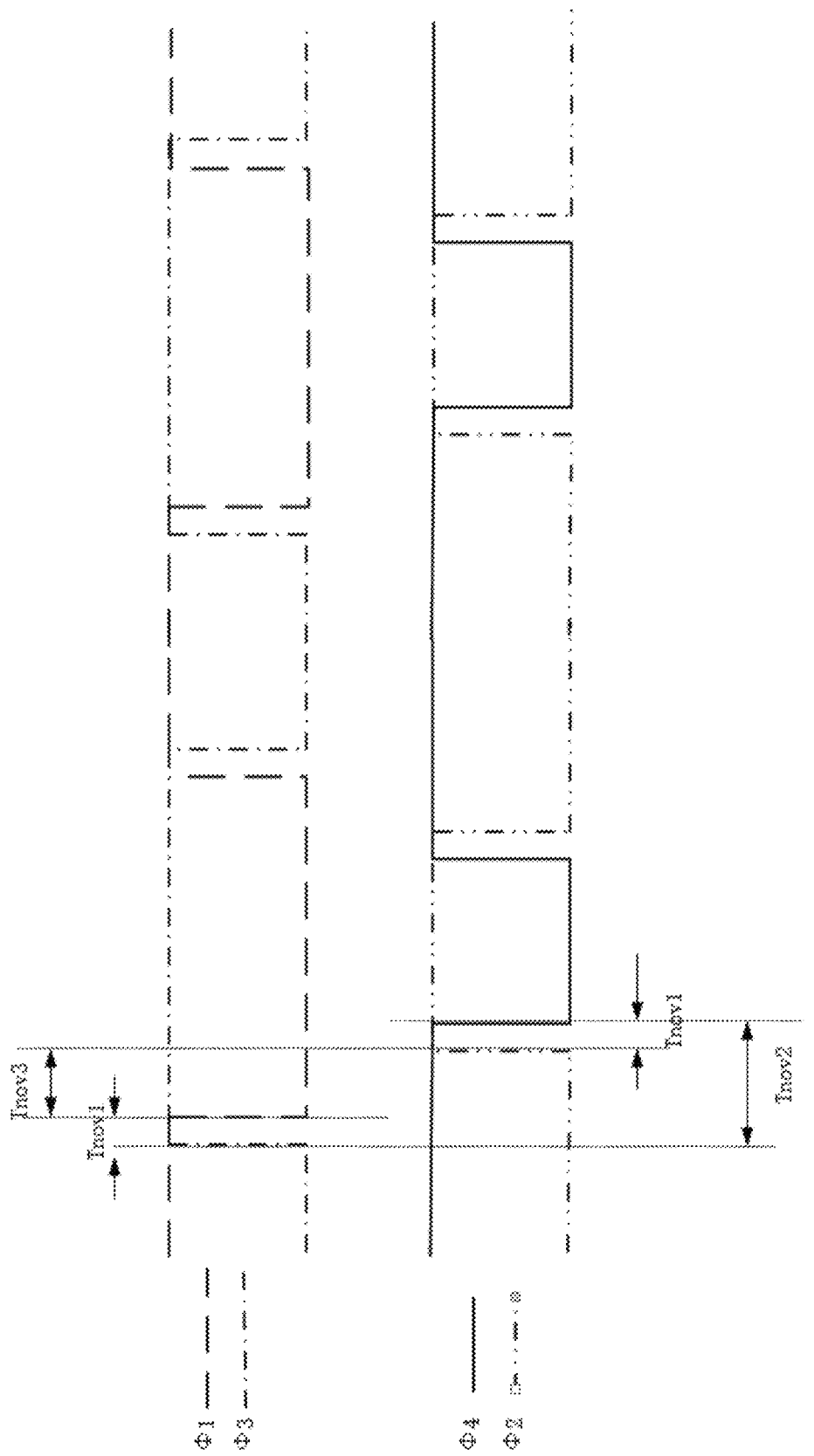
FIG. 5 is a schematic sequence diagram of a charge pump circuit provided by an embodiment of the present invention.

As shown in FIG. 5, when the clock signals $\Phi 1$-$\Phi 4$ outputted by the same output node in the phase clock generation module 101 controls on and off of the corresponding select switches SW1-SW4, the clock signals $\Phi 1$-$\Phi 4$ need to meet the requirement that the first clock signal $\Phi 1$ and the third clock signal $\varnothing 3$ are non-overlapping clock signals, and the second clock signal $\Phi 2$ and the fourth clock signal ¢4 are non-overlapping clock signals, wherein the non-overlapping time is Tnov1; and the first clock signal $\varnothing 1$ and the second clock signal $\Phi 2$ are non-overlapping clock signals, and the third clock signal $\Phi 3$ and the fourth clock signal ¢4 are also non-overlapping clock signals, wherein the non-overlapping time is Tnov3 and Tnov2 respectively, and the relationship of the non-overlapping time of the clock signals $\Phi 1$-$\Phi 4$ is Tnov2=2*Tnov1+Tnov3.

On the basis of the control of the foregoing non-overlapping clock signals, the capacitors C4-C7 are charged in a time-sharing manner, so that the capacitors charged by the input power supply Vin at the same time are reduced, and thus the charge current of the input power supply to the capacitors C4-C7 and the resulting input power supply ripples are reduced. Specifically, in an initial state, since all of the clock signals $\Phi 1$-$\Phi 4$ are at a low level, the movable ends of the select switches SW1-SW4 are controlled by means of the clock control ends to be connected to the grounding end GND, so that polar plates A and B of the fourth capacitor C5 and the third capacitor C4 are charged to the level of Vin by body diodes of the third NMOS transistor MN7 and the fourth NMOS transistor MN8. Similarly, the output voltage end VOUT and the initial levels of polar plates C and D of the fifth capacitor C6 and the sixth capacitor C7 are the input power supply Vin. It is assumed that C4=C5=C6=C7=C; and therefore, initial storage charges of the capacitors C4-C7 are CVin.

When the clock signals $\Phi 2$ and $\Phi 3$ are at a low level, the polar plates of the fourth capacitor C5 and the fifth capacitor C6, which are connected to the second select switch SW2 and the third select switch SW3 respectively, are connected to the power supply VDD for charging, the fourth capacitor C5 and the fifth capacitor C6 are in a charging state, and the voltages of the polar plates A and C of the fourth capacitor C5 and the fifth capacitor C6 are the sum of the input power supply Vin and the power supply VDD. Meanwhile, when the clock signals $\Phi 1$ and $\Phi 4$ are at a high level, the first select switch SW1 and the fourth select switch SW4 enables the polar plates of the third capacitor C4 and the six capacitor C7, which are connected to the first select switch and the fourth select switch, to be short-circuited to the grounding end GND, the third capacitor C4 and the sixth capacitor C7 are in a maintaining state, and the voltages of the polar plates B and D of the third capacitor C4 and the sixth capacitor C7 are the input power supply Vin. At the time, the third NMOS transistor MN7 is switched on, the fourth NMOS transistor MN8 is switched off, the second PMOS transistor MP4 and the fifth PMOS transistor MP7 are switched on, and the third PMOS transistor MP5 and the fourth PMOS transistor MP6 are switched off, so that charges in the fifth capacitor C6 and the fourth capacitor C5 are transferred into the eighth capacitor C8 for charging the eighth capacitor C8, and the third capacitor C4 and the sixth capacitor C7 are in a maintaining state.

After the clock signals Φ2 and Φ3 are switched from the low level to the high level, the polar plates of the fourth capacitor C5 and the fifth capacitor C6, which are connected to the second select switch SW2 and the third select switch SW3 respectively, are short-circuited to the ground, so that the capacitor voltage cannot be changed suddenly, a voltage difference between the fourth capacitor C5 and the fifth capacitor C6 is still the input power supply Vin, and therefore, the voltages of the polar plates A and C of the fourth capacitor C5 and the fifth capacitor C6 are the input power supply Vin. At the time, the clock signals Φ1 and Φ4 are switched from the high level to the low level, the polar plates of the third capacitor C4 and the sixth capacitor C7, which are connected to the first select switch SW1 and the fourth select switch SW4, are connected to the power supply VDD, so that the voltages of the polar plates B and D of the third capacitor C4 and the sixth capacitor C7 are the sum of the input power supply Vin and the power supply VDD. Therefore, the third NMOS transistor MN7 is switched off, the fourth NMOS transistor MN8 is switched on, the second PMOS transistor MP4 and the fifth PMOS transistor MP7 are switched off, the fourth PMOS transistor MP6 and the third PMOS transistor MP5 are switched on, to transfer the charges in the third capacitor C4 and the sixth capacitor C7 into the eighth capacitor C8 for charging the eighth capacitor C8, and the fourth capacitor C5 and the fifth capacitor C6 are in a maintaining state.

Therefore, due to the select switches SW1-SW4 controlled based on the non-overlapping clocks, the third capacitor C4 and the sixth capacitor C7, as well as the fourth capacitor C5 and the fifth capacitor C6 do not draw currents from the power supply VDD at the same time, so that the peak current of the power supply VDD is significantly reduced. However, during a charge transfer process, the third capacitor C4 and the sixth capacitor C7, or the fourth capacitor C5 and the fifth capacitor C6 jointly transfer the charges to the eighth capacitor C8. At the time of clock toggling, only one capacitor state is switched each time, so that the ripples of the output voltage VOUT of each of the sub charge pump modules is also significantly reduced. Through a plurality of clock periods, finally VOUT is equal to Vin+VDD, so that each of sub charge pump modules achieves static output, and the voltage output is higher than the input power supply. For example, when it is assumed that the fourth capacitor C5 and the fifth capacitor C6 are in the state of transferring charges to the eighth capacitor C8, and the third capacitor C4 and the sixth capacitor C7 are in a charging state, at the moment of clock toggling, the fourth capacitor C5 may be firstly switched from the transfer state to the charging state, the fifth capacitor C6 is then switched from the transfer state to the charging state, and the third capacitor C4 is then switched from the charging state to the transfer state, and finally switched from the charging state to the transfer state.

Figure 6:
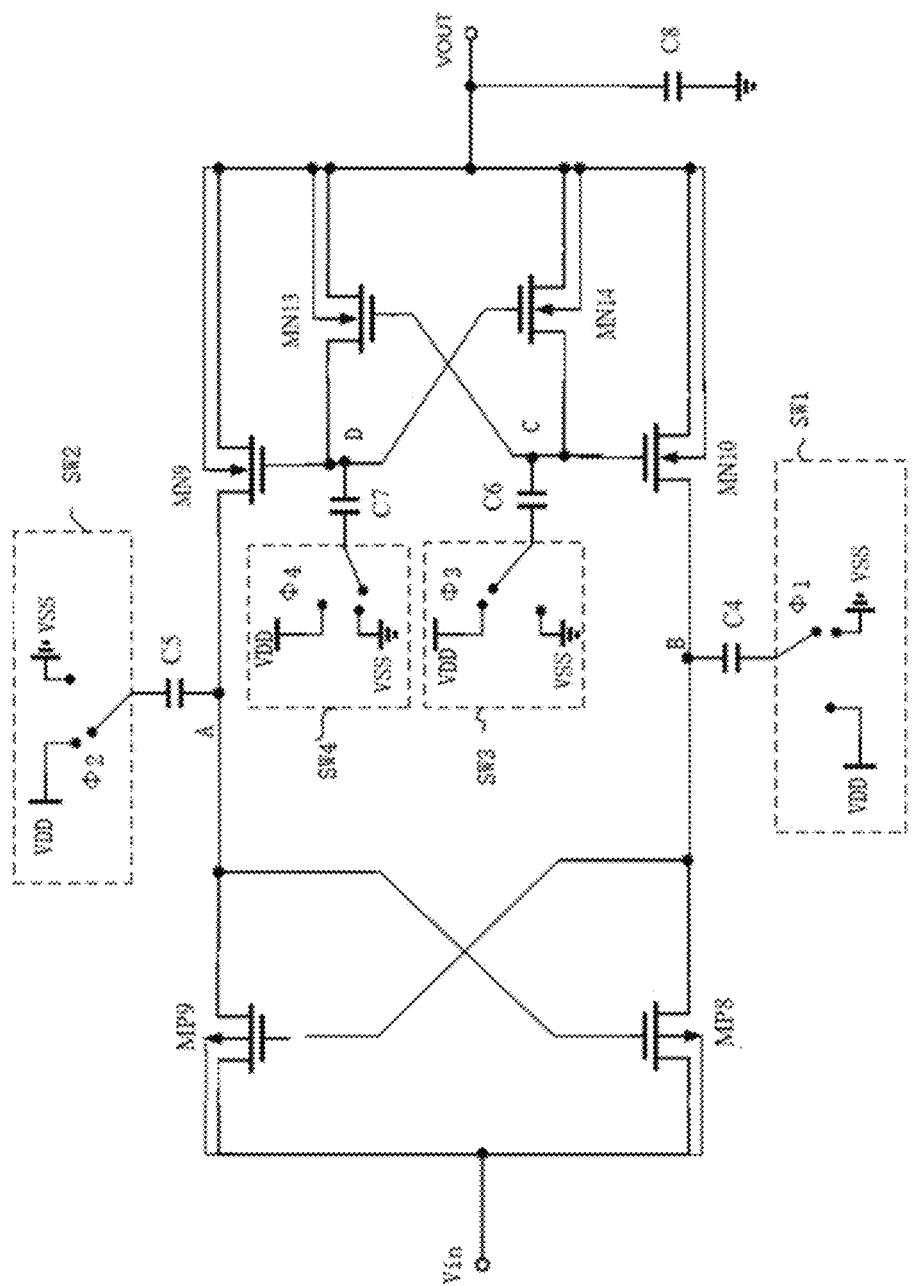
FIG. 6 is another schematic circuit diagram of each of the sub charge pump modules in a charge pump circuit provided by an embodiment of the present invention.

In addition to providing the voltage output higher than the input power supply Vin, each of the sub charge pump modules may also provide the voltage output lower than a grounding voltage VSS. As shown in FIG. 6, when the voltage output lower than the grounding voltage VSS needs to be provided, it is only necessary to replace the third NMOS transistor MN7 and the fourth NMOS transistor MN8 in each of the sub charge pump modules with the sixth PMOS transistor MP8 and the seventh PMOS transistor MP9, and correspondingly replace the second PMOS transistor MP4, the third PMOS transistor MP5, the fourth PMOS transistor MP6 and the fifth PMOS transistor MP7 with the fifth NMOS transistor MN9, the sixth NMOS transistor MN10, the ninth NMOS transistor MN13 and the tenth NMOS transistor MN14. This implementation process is a reverse process of the process that each of the sub charge pump modules provides the voltage output higher than the input power supply Vin, which is not repeated here.

Figure 7:
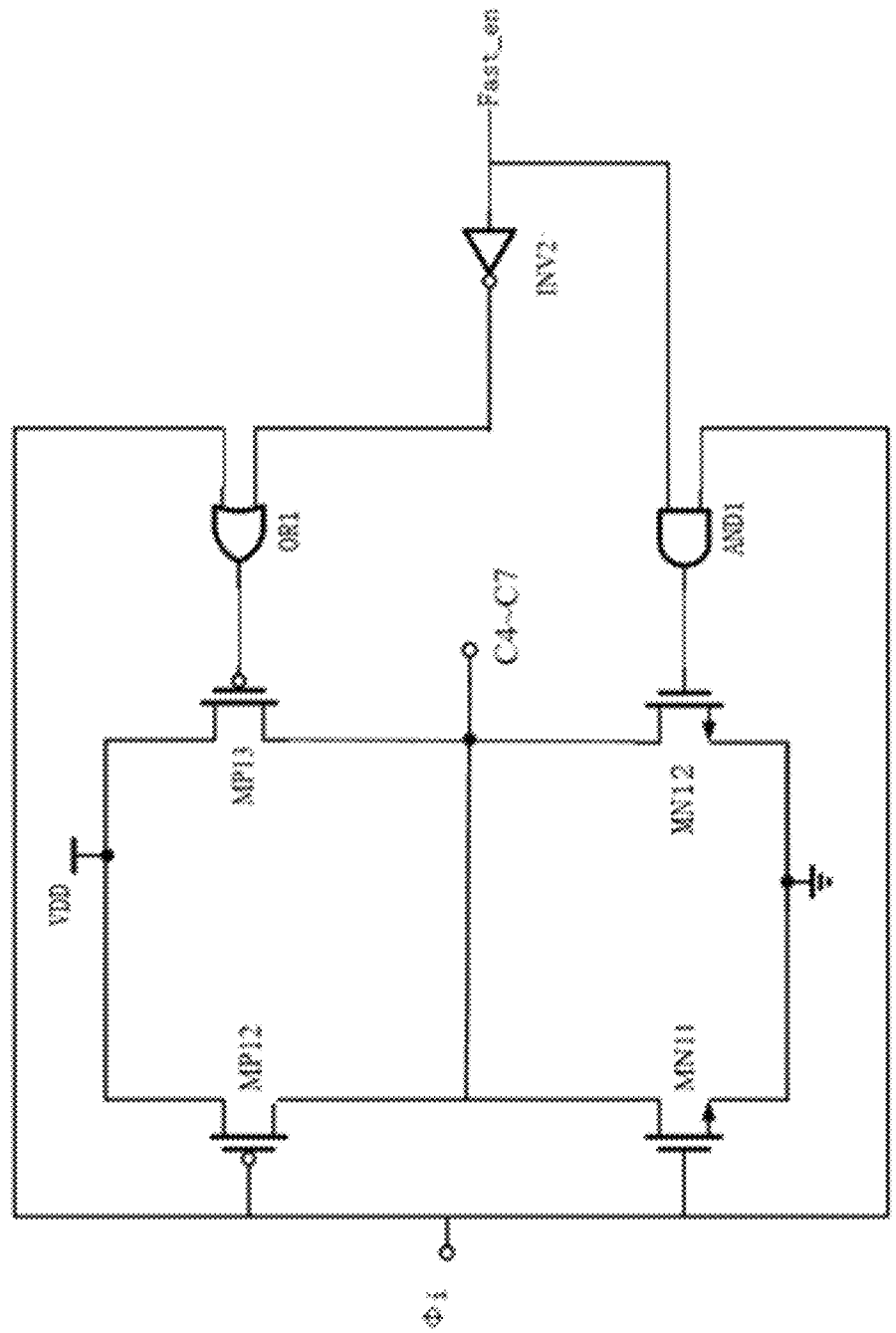
FIG. 7 is a schematic circuit diagram of a select switch of each of the sub charge pump modules in a charge pump circuit provided by an embodiment of the present invention.

To be able to generate the output voltage rapidly, the select switches SW1-SW4 may be optimized. That is, the select switches SW1-SW4 are equivalent to an acceleration select switch. As shown in FIG. 7, each of the select switches includes a tenth PMOS transistor MP12, a seventh NMOS transistor MN11, an OR-gate OR1, an AND-gate AND1, a third phase inverter INV2, at least one eleventh PMOS transistor MP13 and at least one eighth NMOS transistor MN12. The connection relationship of the parts of the select switch is as follows. A grid of the tenth PMOS transistor MP12 and a grid of the seventh NMOS transistor MN11 are connected together to serve as a clock control end of the select switch, to be connected to a certain output node of the phase clock generation module 101, to receive a clock signal Φi (any clock signal of the clock signals Φ1-Φ4) outputted by the phase clock generation module 101. The grids of the tenth PMOS transistor MP12 and the seventh NMOS transistor MN11 are further correspondingly connected to an input end of the OR-gate OR1 and an input end of an AND-gate AND1. Drains of the tenth PMOS transistor MP12 and the seventh NMOS transistor MN11 and drains of each of the eleventh PMOS transistors MP13 and the corresponding eighth NMOS transistor MN12 are connected together to serve as a movable end of the select switch, to be connected to the other polar plate of the corresponding capacitor (a certain capacitor of the capacitors C4-C7). Sources of the tenth PMOS transistor MP12 and each of the eleventh PMOS transistors MP13 are separately connected to the power supply VDD. Sources of the seventh NMOS transistor MN11 and each of the eighth NMOS transistors MN12 are separately grounded. A grid of each of the eleventh PMOS transistors MP13 is connected to an output end of the OR-gate OR1. A grid of each of the eighth NMOS transistors MN12 is connected to an output end of the AND-gate. The other input end of the OR-gate OR1 is connected to an output end of the third phase inverter INV2. The other input end of the AND-gate AND1 is connected to an input end of the third phase inverter INV2 and an output end of the acceleration response control module 105.

When the acceleration response control module 105 measures that the output voltage of each of the sub charge pump modules does not reach the target value, the logic signal fast_en outputted by the acceleration response control module 105 to the third phase inverter INV2 is at a high level. When the clock signal Φi is at a high level, the output of the AND-gate AND1 is at a high level, so that the seventh NMOS transistor MN11 and the at least one eighth NMOS transistor MN12 are connected in parallel, and the pull-down resistance corresponding to each of the sub charge pump modules is reduced. That is, the discharging current of the eighth capacitor R8 connected to the output voltage end of each of the sub charge pump modules is increased, and the on resistance of a discharging path is reduced. Similarly, when the clock signal di is at a low level, the output of the OR-gate OR11 is at a low level, so that the pull-up resistance of the output voltage VOUT is the shunt impedance of the tenth PMOS transistor MP12 and at least one eleventh PMOS transistor MP13, and the pull-up resistance corresponding to each of the sub charge pump modules is reduced. That is, the charge current of the eighth capacitor R8 connected to the output voltage end of each of the sub charge pump modules is increased, and the on resistance of a charging path is reduced.

When the frequency of the clock signal di becomes higher, the charging speed of each of the sub charge pump modules to C4-C7 under the control of the high-frequency clock signal is improved by the way of reducing the on impedance of the third phase inverter INV2, thereby reducing the setup time of the output voltage of each of the sub charge pump modules. Meanwhile, after the output voltage of each of the sub charge pump modules reaches a steady-state value, the logic signal is 0. When the clock signal Pi is at a low level or a high level, the on impedance of the third phase inverter INV2 is separately determined by the on resistance of the tenth PMOS transistor MP12 and the seventh NMOS transistor MN11. At the time, the frequency of the clock signal Φi is reduced, and the pull-up resistance and pull-down resistance of the select switch are increased, as long as it does not affect the charging performance of each of the sub charge pump modules. Therefore, after the output voltage of each of the sub charge pump modules reaches the steady state, since the pull-up resistance and pull-down resistance of the select switch are increased, so that the speed of the capacitors C4-C7 drawing the current from the power supply is slowed down, which can further reduce the peak current of the input power supply when the charge pump circuit works.

Figure 8:
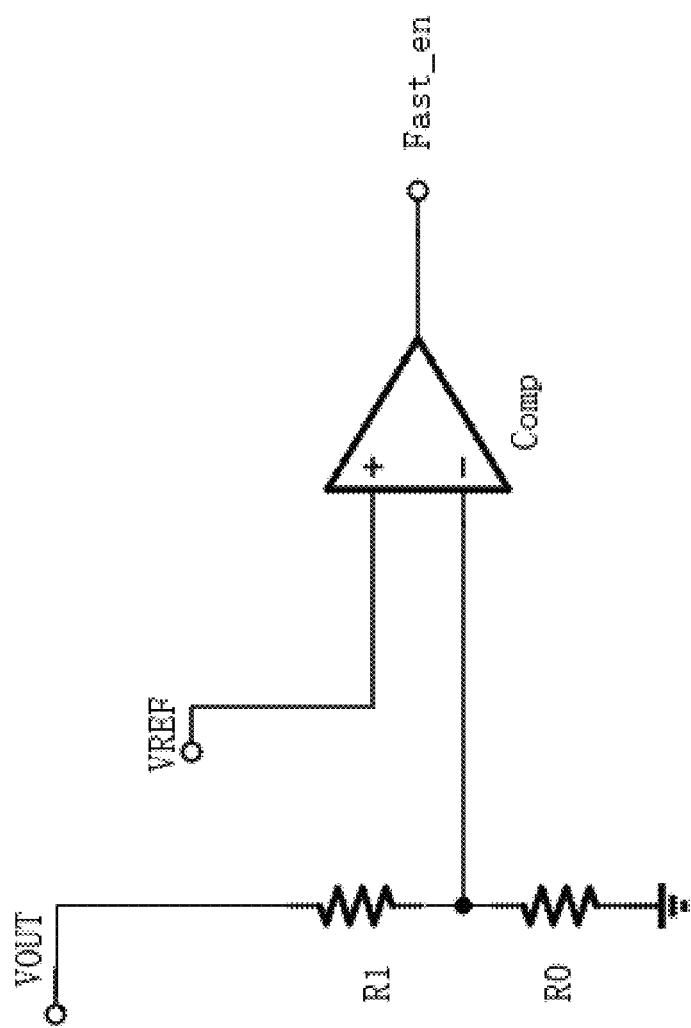
FIG. 8 is a schematic circuit diagram of an acceleration response control module in a charge pump circuit provided by an embodiment of the present invention.

As shown in FIG. 8, the acceleration response control module 105 includes a first resistor R1, a second resistor R0 and a hysteresis comparator Comp. One end of the first resistor R1 is connected to an output voltage end VOUT of each of the sub charge pump modules. The other end of the first resistor R1 is separately connected to one end of the second resistor R0 and an inverting input end of the hysteresis comparator Comp. The other end of the second resistor R0 is grounded. A positive phase input end of the hysteresis comparator Comp is connected to a reference voltage VREF. An output end of the hysteresis comparator Comp is connected to an input end of the first phase inverter INV1 in the phase clock generation module 101 and an input end of the third phase inverter INV2 in each of the sub charge pump modules.

The output voltage of each of the sub charge pump modules is measured by means of the acceleration response control module 105. When the output voltage of each of the sub charge pump modules does not reach the target value, the logic signal fast_en outputted by the hysteresis comparator Comp is at a high level, and is outputted to the phase clock generation module 101 and each of the sub charge pump modules. In a phase clock generation module, the oscillation frequency of the ring oscillator is changed, and in each of the sub charge pump modules, the charge and discharge speed of the capacitor is adjusted, so that each of the sub charge pump modules generates the output voltage rapidly. When the output voltage of each of the sub charge pump modules reaches the target value, the logic signal fast_en outputted by the hysteresis comparator Comp is at a low level, so that the charge pump circuit operates at low peak value current and low power consumption. In order to determine whether the output voltage of each of the sub charge pump modules reaches the target value, a turnover voltage threshold may be set in the hysteresis comparator Comp. The turnover voltage threshold is VREF(1+R1/R0). By adjusting the ratio of the first resistor R1 to the second resistor R0, the turnover voltage threshold may be set. If the output voltage of each of the sub charge pump modules reaches the turnover voltage threshold, it is considered that the output voltage of each of the sub charge pump modules reaches the target value.

It should be noted that the charge pump circuit provided by this embodiment of the present invention can be applied to an analog integrated circuit chip. The specific structure of the charge pump circuit in the analog integrated circuit chip will not be described in detail here.

The foregoing charge pump circuit can also be applied to various kinds of communication terminals, to serve as an important part of the analog integrated circuit. The communication terminal here refers to computer devices that can be used in a mobile environment and supports various communication systems such as GSM, EDGE, TDD_LTE, FDD_LTE and 5GNR, including mobile phones, laptops, tablet computers, car computers, etc. In addition, the technical solution provided by the present invention is also applied to other analog integrated circuit applications, such as communication base stations.

Compared with the prior art, the charge pump circuit provided by the present invention generates the plurality of clock signals with the fixed phase difference by means of the phase clock generation module, to correspondingly control the plurality of sub charge pump modules to generate the output voltages, measures the output voltage of each of the sub charge pump modules by means of the acceleration response control module, and separately outputs the logic signal to the phase clock generation module and each of the sub charge pump modules, to change the frequency of the clock signals outputted by the phase clock generation module, and reduce the charge and discharge time of the capacitor in each of the sub charge pump modules. By using the present invention, the peak current drawn by the charge pump circuit from the input power supply can be effectively reduced, and ripple interference of the charge pump circuit on the input power supply and an output voltage signal is reduced, thereby reducing the dependence of the input power supply on an off-chip capacitor.

The charge pump circuit, the chip and the communication terminal provided by the present invention are described in detail above. Any obvious alteration made by those of ordinary skill in the art to the present invention without deviating from the substance of the present invention shall fall within the scope of protection of the present invention.

What is claimed is:

1. A charge pump circuit, comprising a phase clock generation module, an acceleration response control module and a plurality of sub charge pump modules, wherein an output end of the phase clock generation module is connected to a clock control end of each of the sub charge pump modules, the plurality of sub charge pump modules are connected in parallel and then correspondingly connected to an input power supply end and an output voltage end, the output voltage end is connected to an input end of the acceleration response control module, and an output end of the acceleration response control module is connected to input ends of the phase clock generation module and each of the sub charge pump modules;

the phase clock generation module generates a plurality of clock signals with a fixed phase difference, to correspondingly control the plurality of sub charge pump modules to generate output voltages, and meanwhile after the output voltages are measured by means of the acceleration response control module, separately outputs a logic signal to the phase clock generation module and each of the sub charge pump modules, so that when the output voltages do not reach a target value, the phase clock generation module generates an acceleration clock signal to generate the output voltages rapidly, and when the output voltages reach the target value, the phase clock generation module controls each of the sub charge pump modules to maintain the normal output voltage.

2. The charge pump circuit according to claim 1, wherein: the phase clock generation module comprises a first phase inverter and a plurality of phase clock sub circuits each composed of a first NMOS transistor, a first capacitor, a second capacitor, an output node and a second phase inverter, wherein an input end of the first phase inverter is connected to an output end of the acceleration response control module, an output end of the first phase inverter is connected to a gate of each of the first NMOS transistors, the first capacitor is serially connected between a drain of each of the first NMOS transistors and the corresponding output node, a source of each of the first NMOS transistors is grounded, each of the output nodes is connected to the corresponding sub charge pump module, the second capacitor is serially connected between each of the output nodes and the ground, and after being cascaded and correspondingly connected to a power supply and the ground, the second phase inverters are connected end to end to form a ring oscillator.

3. The charge pump circuit according to claim 2, wherein: the second phase inverter comprises a first PMOS transistor and a second NMOS transistor, a gate and a drain of the first PMOS transistor are correspondingly connected to a gate and a drain of the second NMOS transistor, a source of the first PMOS transistor is connected to the power supply, and a source of the second NMOS transistor is grounded.

4. The charge pump circuit according to claim 2, wherein: according to a state of the logic signal outputted by the acceleration response control module to the phase clock generation module, the size of a load capacitor of the output node of the phase clock generation module is changed, to adjust the size of an oscillation frequency of the plurality of clock signals with the fixed phase difference generated by the ring oscillator.

5. The charge pump circuit according to claim 2, wherein: according to a state of the logic signal outputted by the acceleration response control module to the phase clock generation module, a width to length ratio of a switching tube transistor in each of the second phase inverters is changed, to change equivalent resistance of the second phase inverter, so as to adjust the size of an oscillation frequency of the plurality of clock signals with the fixed phase difference generated by the ring oscillator.

6. The charge pump circuit according to claim 1, wherein: when each of the sub charge pump modules provides a voltage output higher than an input power supply, each of the sub charge pump modules comprises a third NMOS transistor, a fourth NMOS transistor, a second PMOS transistor, a third PMOS transistor, a fourth PMOS transistor, a fifth PMOS transistor, a first select switch, a second select switch, a third select switch, a fourth select switch, a third capacitor, a fourth capacitor, a fifth capacitor, a sixth capacitor and an eighth capacitor, wherein a substrate end and a source of the third NMOS transistor, as well as a substrate end and a source of the fourth NMOS transistor are separately connected to the input power supply; a gate of the third NMOS transistor is separately connected to a drain of the fourth NMOS transistor, a polar plate of the fourth capacitor and a drain of the second PMOS transistor; a drain of the third NMOS transistor is separately connected to a gate of the fourth NMOS transistor, a polar plate of the third capacitor and a drain of the third PMOS transistor; a substrate end and a source of the second PMOS transistor, a substrate end and a source of the third PMOS transistor, a substrate end and a source of the fourth PMOS transistor, as well as a substrate end and a source of the fifth PMOS transistor are respectively connected to the output voltage end and one end of the eighth capacitor, and the other end of the eighth capacitor is grounded; a gate of the second PMOS transistor is separately connected to a polar plate of the sixth capacitor, a drain of the fourth PMOS transistor and a gate of the fifth PMOS transistor; a gate of the third PMOS transistor is separately connected to a polar plate of the fifth capacitor, a drain of the fifth PMOS transistor and a gate of the fourth PMOS transistor; the other polar plates of the third capacitor, the fourth capacitor, the fifth capacitor and the sixth capacitor are connected to movable ends of the corresponding select switches; the movable end of each of the select switches is correspondingly connected to the respective clock control end; the clock control ends of the select switches are correspondingly connected to the same output node of the phase clock generation module; one static end of each of the select switches is connected to the power supply and the other static end is connected to a grounding end; a response control end of each of the select switches is connected to an output end of the acceleration response control module; and an input end of the acceleration response control module is connected to the output voltage end.

7. The charge pump circuit according to claim 6, wherein: each of the select switches comprises a tenth PMOS transistor, a seventh NMOS transistor, an OR-gate, an AND-gate, a third phase inverter, at least one eleventh PMOS transistor and at least one eighth NMOS transistor, wherein gates of the tenth PMOS transistor and the seventh NMOS transistor are connected to serve as a clock control end of the select switch, to be connected to one output node of the phase clock generation module; the gates of the tenth PMOS transistor and the seventh NMOS transistor are correspondingly connected to one input end of the OR-gate and one input end of the AND-gate respectively; drains of the tenth PMOS transistor and the seventh NMOS transistor and drains of each of the eleventh PMOS transistors and the corresponding eighth NMOS transistor are mutually connected to serve as the movable end of the select switch, to be connected to the other polar plate of the corresponding capacitor; sources of the tenth PMOS transistor and each of the eleventh PMOS transistors are separately connected to the power supply; sources of the seventh NMOS transistor and each of the eighth NMOS transistors are separately grounded; a gate of each of the eleventh PMOS transistors is connected to an output end of the OR-gate; a gate of each of the eighth NMOS transistors is connected to an output end of the AND-gate; the other input end of the OR-gate is connected to an output end of the third phase inverter; and the other input end of the AND-gate is connected to an input end of the third phase inverter and an output end of the acceleration response control module.

8. The charge pump circuit according to claim 6, wherein: when the clock signals outputted by a same output node in the phase clock generation module controls on and off of the corresponding select switches, a first clock signal and a third clock signal are non-overlapping clock signals, and a second clock signal and a fourth clock signal are non-overlapping clock signals, wherein the non-overlapping time is Tnov1; and the first clock signal and the second clock signal are non-overlapping clock signals, and the third clock signal and the fourth clock signal are non-overlapping clock signals, wherein the non-overlapping time is Tnov3 and Tnov2 respectively, and the relationship of the non-overlapping time is Tnov2=2*Tnov1+Tnov3.

9. The charge pump circuit according to claim 1, wherein: when each of the sub charge pump modules provides a voltage output lower than a grounding voltage, each of the sub charge pump modules comprises a sixth PMOS transistor, a seventh PMOS transistor, a fifth NMOS transistor, a sixth NMOS transistor, a ninth NMOS transistor, a tenth NMOS transistor, a first select switch, a second select switch, a third select switch, a fourth select switch, a third capacitor, a fourth capacitor, a fifth capacitor, a sixth capacitor and an eighth capacitor, wherein a substrate end and a source of the sixth PMOS transistor, as well as a substrate end and a source of the seventh PMOS transistor are separately connected to the input power supply; a gate of the sixth PMOS transistor is separately connected to a drain of the seventh PMOS transistor, a polar plate of the fourth capacitor and a drain of the fifth NMOS transistor; a drain of the sixth PMOS transistor is separately connected to a gate of the seventh PMOS transistor, a polar plate of the third capacitor and a drain of the sixth NMOS transistor; a substrate end and a source of the fifth NMOS transistor, a substrate end and a source of the sixth NMOS transistor, a substrate end and a source of the ninth NMOS transistor, as well as a substrate end and a source of the tenth NMOS transistor are respectively connected to the output voltage end and one end of the eighth capacitor, and the other end of the eighth capacitor is grounded; a gate of the fifth NMOS transistor is separately connected to a polar plate of the sixth capacitor, a drain of the ninth NMOS transistor and a gate of the tenth NMOS transistor; a gate of the sixth NMOS transistor is separately connected to a polar plate of the fifth capacitor, a drain of the tenth NMOS transistor and a gate of the ninth NMOS transistor; the other polar plates of the third capacitor, the fourth capacitor, the fifth capacitor and the sixth capacitor are connected to movable ends of the corresponding select switches; the movable end of each of the select switches is correspondingly connected to the respective clock control end; the clock control ends of the select switches are correspondingly connected to the same output node of the phase clock generation module; one static end of each of the select switches is connected to the power supply and the other static end is connected to a grounding end; a response control end of each of the select switches is connected to an output end of the acceleration response control module; and an input end of the acceleration response control module is connected to the output voltage end.

10. The charge pump circuit according to claim 1, wherein:

the acceleration response control module comprises a first resistor, a second resistor and a hysteresis comparator, wherein one end of the first resistor is separately connected to an output voltage end of each of the sub charge pump modules, the other end of the first resistor is separately connected to one end of the second resistor and an inverting input end of the hysteresis comparator, the other end of the second resistor is grounded, a positive phase input end of the hysteresis comparator is connected to a reference voltage, an output end of the hysteresis comparator is separately connected to an input end of the first phase inverter and an input end of a third phase inverter in each of the sub charge pump modules.

11. An integrated circuit chip, comprising a charge pump circuit according to claim 1.

12. A communication terminal, comprising the charge pump circuit according to claim 1.

* * * * *